(12) United States Patent
DeHaven et al.

(10) Patent No.: US 9,224,675 B1
(45) Date of Patent: Dec. 29, 2015

(54) AUTOMATIC CAPACITANCE TUNING FOR ROBUST MIDDLE OF THE LINE CONTACT AND SILICIDE APPLICATIONS

(71) Applicant: International Business Machines Corporation, Armonk, NY (US)

(72) Inventors: Patrick W. DeHaven, Poughkeepsie, NY (US); Brett H. Engel, Ridgefield, CT (US); Domingo A. Ferrer, Fishkill, NY (US); Arun Vijayakumar, Poughkeepsie, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/447,672

(22) Filed: Jul. 31, 2014

(51) Int. Cl.
*H01L 21/4763* (2006.01)
*H01L 23/48* (2006.01)
*H01L 21/768* (2006.01)

(52) U.S. Cl.
CPC .......... *H01L 23/481* (2013.01); *H01L 21/7685* (2013.01); *H01L 21/76841* (2013.01); *H01L 21/76846* (2013.01); *H01L 21/76879* (2013.01)

(58) Field of Classification Search
CPC ................ H01L 21/76841; H01L 21/76846

USPC ............................ 257/758, 763; 438/622, 643
See application file for complete search history.

(56) References Cited

U.S. PATENT DOCUMENTS

| | | | |
|---|---|---|---|
| 5,290,731 A | 3/1994 | Sugano et al. | |
| 5,565,708 A * | 10/1996 | Ohsaki et al. | ................ 257/764 |
| 5,963,828 A | 10/1999 | Allman et al. | |
| 6,103,623 A | 8/2000 | Lien et al. | |
| 6,187,664 B1 | 2/2001 | Yu | |
| 6,215,186 B1 | 4/2001 | Konecni et al. | |
| 6,828,233 B2 | 12/2004 | Leiphart | |
| 7,407,875 B2 | 8/2008 | Wong et al. | |
| 2009/0108258 A1 | 4/2009 | An | |
| 2011/0209995 A1 | 9/2011 | Rasheed et al. | |
| 2015/0187896 A1 * | 7/2015 | Kamineni et al. | ............ 257/288 |

* cited by examiner

*Primary Examiner* — David Vu
*Assistant Examiner* — Brandon Fox
(74) *Attorney, Agent, or Firm* — Steven J. Meyers; Hoffman Warnick LLC

(57) ABSTRACT

A method includes forming a first metal liner conformally along a sidewall and a bottom of a contact opening. A second metal liner is formed above and in direct contact with the first metal liner, a grain size of the first metal liner is larger than a grain size of the second metal liner. A barrier layer is formed above and in direct contact with the second metal liner and the contact opening is filled with a conductive material to form a middle-of-the-line contact.

20 Claims, 7 Drawing Sheets

AUTOMATIC CAPACITANCE TUNING FOR ROBUST MIDDLE OF THE LINE CONTACT AND SILICIDE APPLICATIONS

BACKGROUND

The present invention generally relates to semiconductor manufacturing and more particularly to the formation of middle-of-the-line (MOL) contacts having a bilayer oxygen getter film.

In semiconductor technologies, tungsten (W) is typically used as a middle-of-the-line (MOL) contact material mainly because of its relatively low resistance, less stress, and electro-migration properties. A MOL contact may be a conductive stud working as an interface between contact areas of an active semiconductor device (or integrated circuit), which may be referred to as front-end-of-the-line (FEOL), and its overlying interconnects structures, which may be referred to as back-end-of-the-line (BEOL). Contact areas of an active semiconductor device may be made of, for example, a silicide material. MOL contacts are usually formed in a layer of dielectric material deposited on top of the active semiconductor device. A plurality of openings may be formed in the layer of dielectric material to form the MOL contacts. The MOL contacts may extend to surfaces of the contact areas of underlying semiconductor devices.

SUMMARY

According to an embodiment of the present disclosure a method may include: forming a first metal liner conformally along a sidewall and a bottom of a contact opening, forming a second metal liner above and in direct contact with the first metal liner, a grain size of the first metal liner may be larger than a grain size of the second metal liner, forming a barrier layer above and in direct contact with the second metal liner, and filling the contact opening with a conductive material to form a middle-of-the-line contact.

According to another embodiment of the present disclosure, a method may include: providing a semiconductor device, the semiconductor device may include a contact area, depositing a dielectric layer above the semiconductor device and above the contact area, etching the dielectric layer to form an opening, the opening in the dielectric layer may expose the contact area of the semiconductor device, depositing a first metal liner along a sidewall and a bottom of the opening, the first metal liner positioned directly above the contact area, depositing a second metal liner in the opening above and in direct contact with the first metal liner, a grain size of the first metal liner may be larger than a grain size of the second metal liner, depositing a barrier layer in the opening above and in direct contact with the second metal liner, and filling the opening with a conductive material to form a middle-of-the-line contact.

According to another embodiment of the present disclosure a structure may include: a semiconductor device including a contact area, a dielectric layer above the semiconductor device, and a middle-of-the-line contact in the dielectric layer, the middle-of-the-line contact may include a first metal liner along a sidewall and a bottom of the middle-of-the-line contact and directly above the contact area, a second metal liner above and in direct contact with the first metal liner, a grain size of the first metal liner may be larger than a grain size of the second metal liner, a barrier layer above and in direct contact with the second metal liner, and a conductive material above the barrier layer, the conductive material substantially fills the middle-of-the-line contact.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
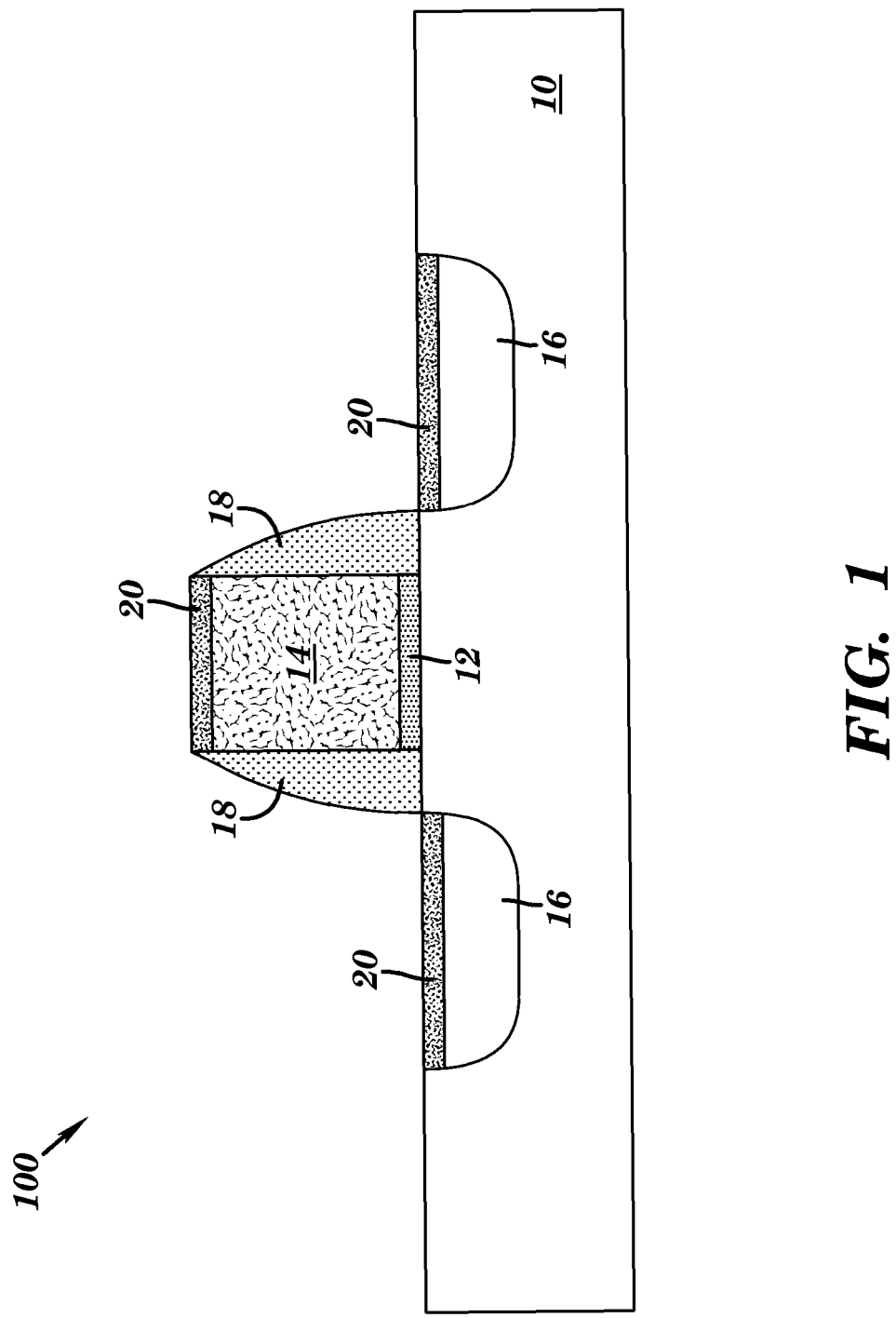
FIG. 1 is a cross-sectional view of a semiconductor structure, according to an embodiment of the present disclosure.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As critical dimensions shrink and technology advances towards 10 nm nodes, metallic films used to fill contact openings in middle-of-the-line (MOL) may entail stringent requirements for memory and logic manufacturers in reducing device contact and interconnects resistivity. Typically, reduction of contact resistance in MOL tungsten contacts may involve using a metal liner with two components: a barrier layer and an oxygen getter film (a film with high affinity for oxygen). The barrier layer may generally include titanium nitride (TiN) which may serve to avoid fluorine diffusion from a tungsten hexafluoride ($WF_6$) precursor used during tungsten deposition, the oxygen getter film is commonly titanium (Ti). The barrier layer may be deposited by an atomic layer deposition (ALD) process and the oxygen getter by an ionized plasma process (IMP). The chemical reaction between fluorine (F) atoms from the $WF_6$ precursor and the Ti atoms in the oxygen getter film may cause profile distortion of the top critical dimension of MOL contacts for early pinch-off during tungsten metal fill. The F—Ti reaction may also disrupt the bottom critical dimension to create tungsten diffusion that may consume silicide and epi stack in the source-drain regions of the device.

Therefore, by forming a titanium layer or oxygen getter film composed of two titanium liners deposited using different automatic capacitance tuning (ACT) bias combinations prior to depositing the titanium nitride barrier layer, embodiments of the present disclosure may, among other potential benefits, suppress any reaction between fluorine and titanium and reduce contact resistance.

The present invention generally relates to semiconductor manufacturing and more particularly to the formation of middle-of-the-line (MOL) contacts having a bilayer oxygen getter film. One way to form a bilayer oxygen getter film may include forming a first metal liner using a high ACT range in a contact opening followed by forming a second metal liner using a low ACT range directly on top of the first metal liner. One embodiment by which to form the bilayer oxygen getter film is described in detail below by referring to the accompanying drawings in FIGS. 1-7.

Referring now to FIG. 1, a semiconductor structure 100 may be formed or provided, according to an embodiment of the present disclosure. In the depicted embodiment, the semiconductor structure 100 may be, for example, a field effect transistor (FET) device. However, the semiconductor structure 100 may also include other semiconductor devices such as, for example, capacitors, diodes, bipolar transistors, BiCMOS devices, memory devices and the like.

The semiconductor structure 100 may be fabricated by any semiconductor processing technique known in the art including, but not limited to, deposition, lithography, etching, and ion implantation techniques. The semiconductor structure 100 may be formed on a substrate 10. In this embodiment, the substrate 10 may be a bulk semiconductor substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In the depicted embodiment, the substrate 10 may be made of silicon.

In other embodiments, the substrate 10 may be, for example, a semiconductor-on-insulator (SOI) substrate, where a buried insulator layer separates a base substrate from a top semiconductor layer. The components of the semiconductor structure 100, may then be formed in the top semiconductor layer.

At this step of the manufacturing process, the semiconductor 100 may be completed with a gate dielectric 12, a gate electrode 14, gate spacers 18, source-drain regions 16 and contact areas 20. It should be understood by a person skilled in the art that the semiconductor structure 100 may be fabricated using either a replacement metal gate (RMG) or gate last process flow, or a gate first process flow.

The gate dielectric 12 may include any suitable insulating material such as, for example, oxide, nitride, oxynitride or silicate including metal silicates and nitrided metal silicates. In one embodiment, the gate dielectric 12 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The gate dielectric 12 may be formed by any suitable deposition technique known in the art, including chemical vapor deposition (CVD), plasma-assisted CVD, atomic layer deposition (ALD), evaporation, reactive sputtering, chemical solution deposition or other like deposition processes. The physical thickness of the gate dielectric 12 may vary, but typically may have a thickness ranging from about 0.5 nm to about 10 nm. More preferably the gate dielectric 12 may have a thickness ranging from about 0.5 nm to about 3 nm.

The gate electrode 14 may be formed above the gate dielectric 12. The gate electrode 14 may include, for example, Zr, W, Ta, Hf, Ti, Al, Ru, Pa, metal oxide, metal carbide, metal nitride, transition metal aluminides (e.g. $Ti_3Al$, ZrAl), TaC, TiC, TaMgC, and any combination of those materials. In one embodiment, the gate electrode 14 may include tungsten (W). The gate electrode 14 may be deposited by any suitable technique known in the art, for example by ALD, CVD, physical vapor deposition (PVD), molecular beam deposition (MBD), pulsed laser deposition (PLD), or liquid source misted chemical deposition (LSMCD).

The gate spacers 18 may be formed on opposite sidewalls of the gate electrode 14. The gate spacers 18 may be made from an insulator material such as an oxide, nitride, oxynitride, silicon carbon oxynitride, silicon boron oxynitride, low-k dielectric, or any combination thereof. In one embodiment, the gate spacers 18 may be made from a nitride and may be formed by conventional deposition and etching techniques. In various embodiments, the gate spacers 18 may include one or more layers. It should be understood that while the gate spacers 18 are herein described in the plural, the gate spacers 18 may consist of a single spacer surrounding the gate electrode 14.

The source-drain regions 16 may be formed on the substrate 10 adjacent to the gate spacers 18 on opposite sides of the gate electrode 14. Numerous methods of forming source-drain regions are known in the art, any of which may be used to form the source-drain regions 16. In some embodiments, the source-drain regions 16 may be formed by doping portions of the substrate 10. In other embodiments, the source-drain regions 16 may be formed by growing epitaxial semiconductor regions adjacent to the substrate 10. The epitaxial semiconductor regions may extend above and/or below a top surface of the substrate 10.

In the depicted embodiment, the semiconductor structure 100 may also include one or more contact areas 20 that may be formed atop of the source-drain regions 16 and the gate electrode 14. Contact areas 20 may include a silicide material such as, for example, NiSi, $CoSi_2$, TiSi, and $WSi_x$. The contact areas 20 may be formed by means of any silicidation process known in the art. In some embodiments, the contacts areas 20 may not exist at this point of the manufacturing process.

Figure 2:
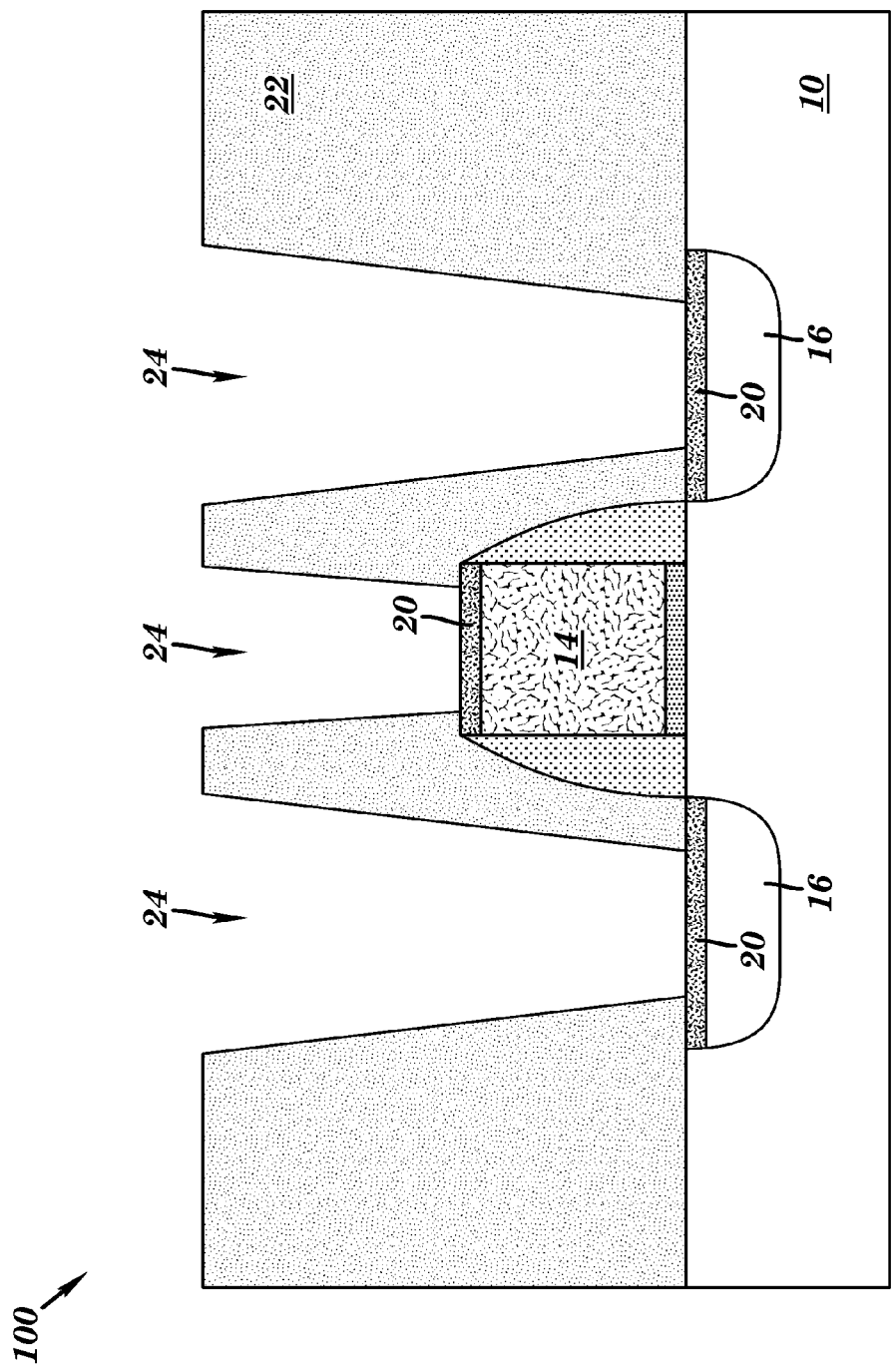
FIG. 2 is a cross-sectional view of the semiconductor structure depicting forming contact openings, according to an embodiment of the present disclosure.

Referring now to FIG. 2, a dielectric layer 22 may be formed above the substrate 10, source-drain regions 16 and gate electrode 14, according to an embodiment of the presence disclosure. The dielectric layer 22 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed by any suitable deposition method known in the art, for example, by CVD of the dielectric material.

A plurality of openings 24 (hereinafter "contact openings") may be patterned and formed in the dielectric layer 22. The contact openings 24 may extend until a top surface of the contact areas 20 is exposed. In embodiments in which the contact areas 20 have not been formed, etching of the contact openings 24 may expose top surfaces of the source-drain regions 16 and a top surface of the gate electrode 14. The contact openings 24 may be formed in the dielectric layer 22 by means of any etching technique known in the art, such as, for example, reactive-ion-etching (RIE). The contact openings 24 may be substantially vertical or may have some tapering as depicted in FIG. 2.

At this step of the manufacturing process, the exposed top surface of the contact areas 20 as well as sidewalls of the contact openings 24 may be subjected to a treatment process which may be capable of removing any surface oxide or etch residue that may be present thereon. In one embodiment, argon (Ar) sputtering and/or contacting with a chemical etchant may be used to remove any surface oxide or etch residue from the contact surfaces 20. It should be noted that although widening of the contact openings 24 may occur during this step, it may be negligible and may not affect device performance.

Figure 3:
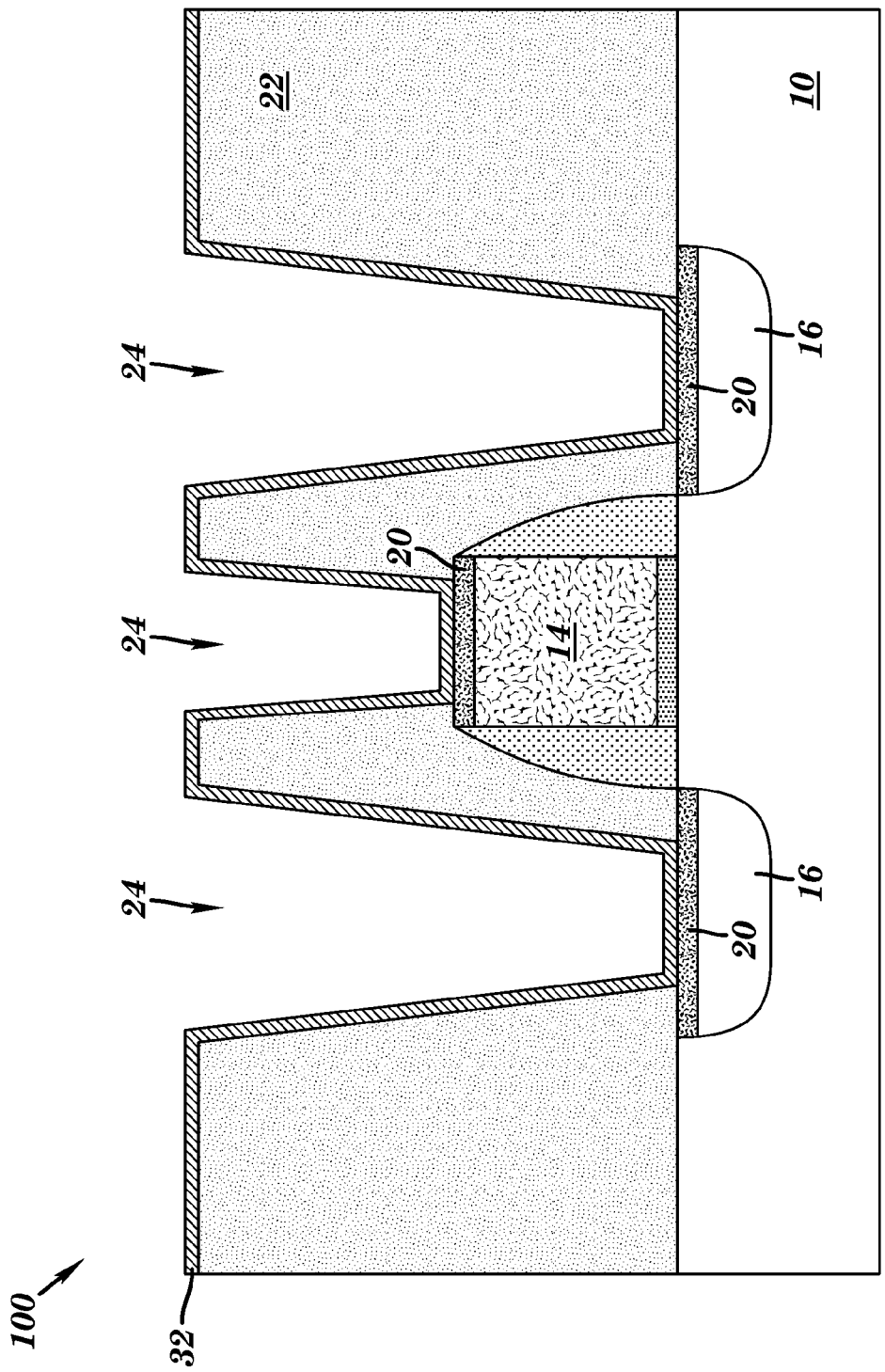
FIG. 3 is a cross-sectional view of the semiconductor structure depicting forming a first metal liner, according to an embodiment of the present disclosure.

Referring now to FIG. 3, a first metal liner 32 may be conformally deposited in the contact openings 24, according to an embodiment of the present disclosure. The first metal liner 32 may substantially cover a perimeter of the contact opening 24. The first metal liner 32 may also cover upper surfaces of the dielectric layer 22 as depicted. The first metal liner 32 may form an interface between a bottom portion of the contact openings 24 and the contact areas 20 of the semiconductor structure 100. The first metal liner 32 may include a titanium (Ti) film formed with an automatic capacitance tuning (ACT) circuit having a normalized capacitance ranging between approximately 75% to approximately 95%. The normalized capacitance of the ACT circuit may be defined as the ratio between nominal capacitance and maximum capacitance. More specifically, the ACT percentage may define the ratio of the nominal capacitance applied in the ACT circuit divided by the maximum capacitance allowed in the tool.

A radio frequency physical vapor deposition (RFPVD) process may be conducted to form the first metal liner 32 in the contact openings 24. The RFPVD chamber may include an ACT resonant circuit (also referred to as ACT circuit) with both an inductor and a capacitor connected in series or parallel, contacting the pedestal where the wafer lies to induce a self-bias effect on the plasma that dislodges the atoms from the metallic target, which deposit on the wafer. The ACT circuit may modulate the impedance along the substrate to ground potential. The radio frequency (RF) potential of the substrate may be controlled by the ACT circuit. This may allow the structural properties of a metallic titanium film, such as the first metal liner 32, to be controlled by varying the capacitance of the ACT circuit. Higher ACT conditions may provide metallic films with a large grain size, aligned texture or aligned crystalline orientation and low electrical resistivity. Whereas low ACT parameters may deposit metallic films with a small grain size and random crystalline orientation.

The RFPVD process may combine elements of conventional physical vapor deposition (PVD) with RF metal sputtering. The RF element may create medium-density plasma transversely through the front of the target. The dislodged metal from the target may diffuse at high chamber pressure, while being ionized as it collides with metastable neutral atoms of the noble gas plasma. The metal ions that land on the wafer may continue to collide with other atoms in the plasma as it approaches to the wafer. These collisions may reduce the ion energy causing a milder sputtering than traditional PVD.

Therefore, the high ACT range used to form the first metal liner 32 may provide a thin titanium film exhibiting low contact resistance and good oxygen scavenging properties. The large grain size of this high ACT Ti film may also induce enhanced titanium silicide formation, due to higher reactivity with silicon or epitaxial diamond shape structures for liner silicide applications.

In embodiments in which the contact areas 20 may not have been formed, the first metal liner 32 may provide a good interface for low-resistivity silicide formation. It should be noted that metallic films formed with higher ACT ranges may have lower resistivity compared with metallic films formed by traditional IMP processes.

The first metal liner 32 may have a thickness varying from approximately 20 Å to approximately 80 Å.

Figure 4:
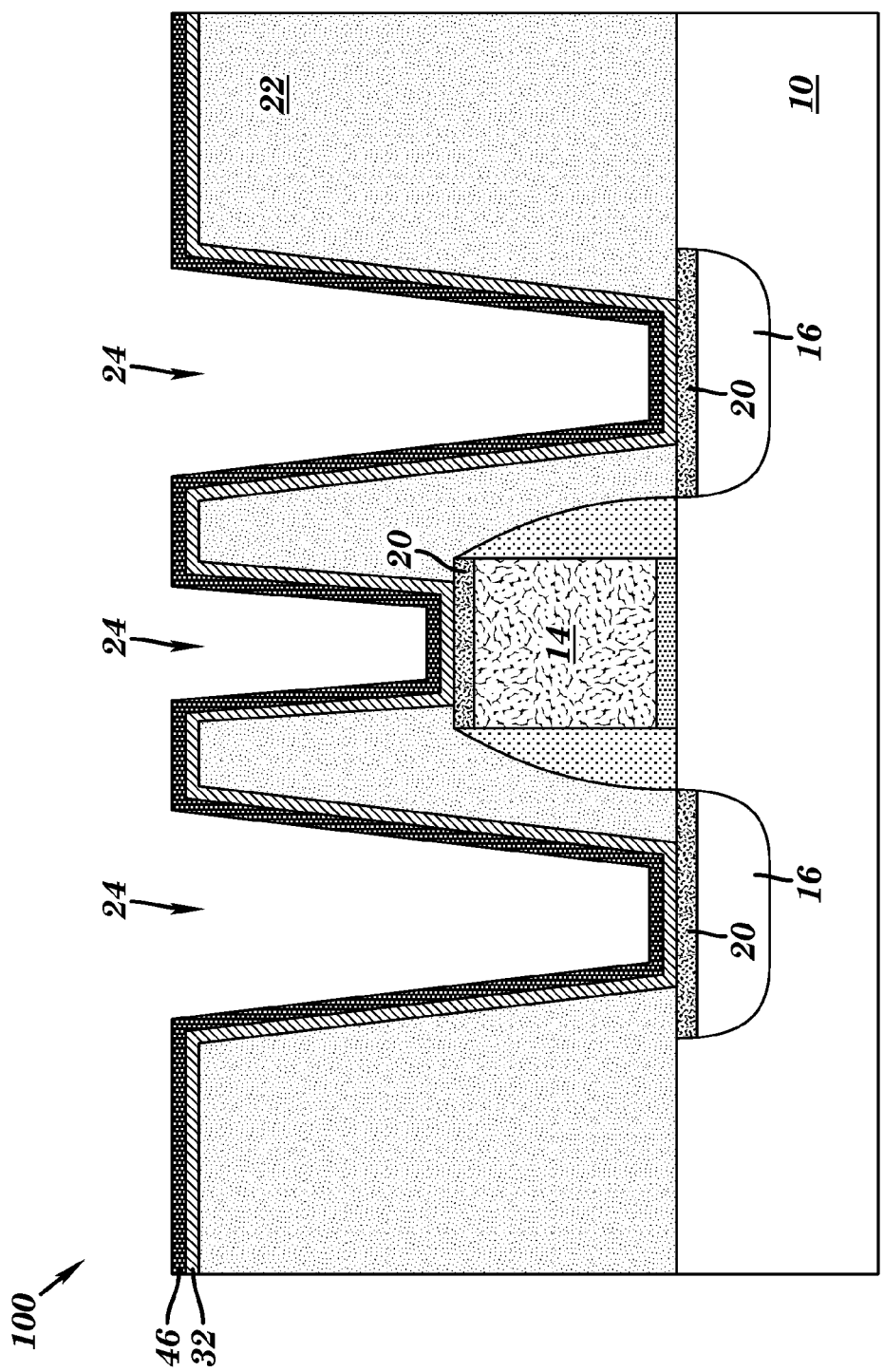
FIG. 4 is a cross-sectional view of the semiconductor structure depicting forming a second metal liner, according to an embodiment of the present disclosure.

Referring now to FIG. 4, a second metal liner 46 may be conformally deposited in the contact openings 24 above and in direct contact with the first metal liner 32, according to an embodiment of the present disclosure. The second metal liner 46 may include a titanium (Ti) film formed with an automatic capacitance tuning (ACT) circuit having a normalized capacitance ranging between approximately 10% to approximately 28%.

The second metal liner 46 may be formed using a similar deposition process as the one conducted to form the first metal liner 32 described above with reference to FIG. 3. In this particular case, a low ACT range may be applied during the RFPVD process in order to form the second metal liner 46 with a smaller grain size than the first metal liner 32 and a random crystalline orientation. The smaller grain size and random crystalline orientation of the second metal liner 46 may help suppressing fluorine diffusion from a subsequently used tungsten hexafluoride ($WF_6$) precursor to the first metal liner 32. The low ACT Ti film may also serve to promote fins merging during annealing steps required in liner silicide applications in silicon or epitaxial diamond shape structures.

The second metal liner 46 may have a thickness varying from approximately 20 Å to approximately 80 Å. It should be noted that although the first metal liner 32 and the second metal liner 46 may have similar thicknesses, in some embodiments the thickness of the second metal liner 46 may be up to one third of the thickness of the underlying first metal liner 32.

The bilayer stack formed by the first metal liner 32 and the second metal liner 46 may provide an oxygen-getter film having different ACT bias combinations that may provide low contact resistance (first metal liner 32) and may suppress F—Ti reaction (second metal liner 46). The first metal liner 32 or high ACT layer may provide a large grain size metallic film that may scavenge oxygen better than a small grain film with random orientation such as the second metal liner 46 or low ACT titanium film. However, the smaller grain size and random orientation of the second metal liner 46 formed on top of the first metal liner 46 may, together with a subsequently formed barrier layer, substantially reduce fluorine diffusion towards the first metal liner 32.

In embodiments in which the contact areas 20 may not exist, the ACT bilayer stack formed by the first metal liner 32 and the second metal liner 46 may serve to form a titanium silicide film with low resistivity as a result of the enhanced coverage observed in the dual ACT bilayer stack.

Figure 5:
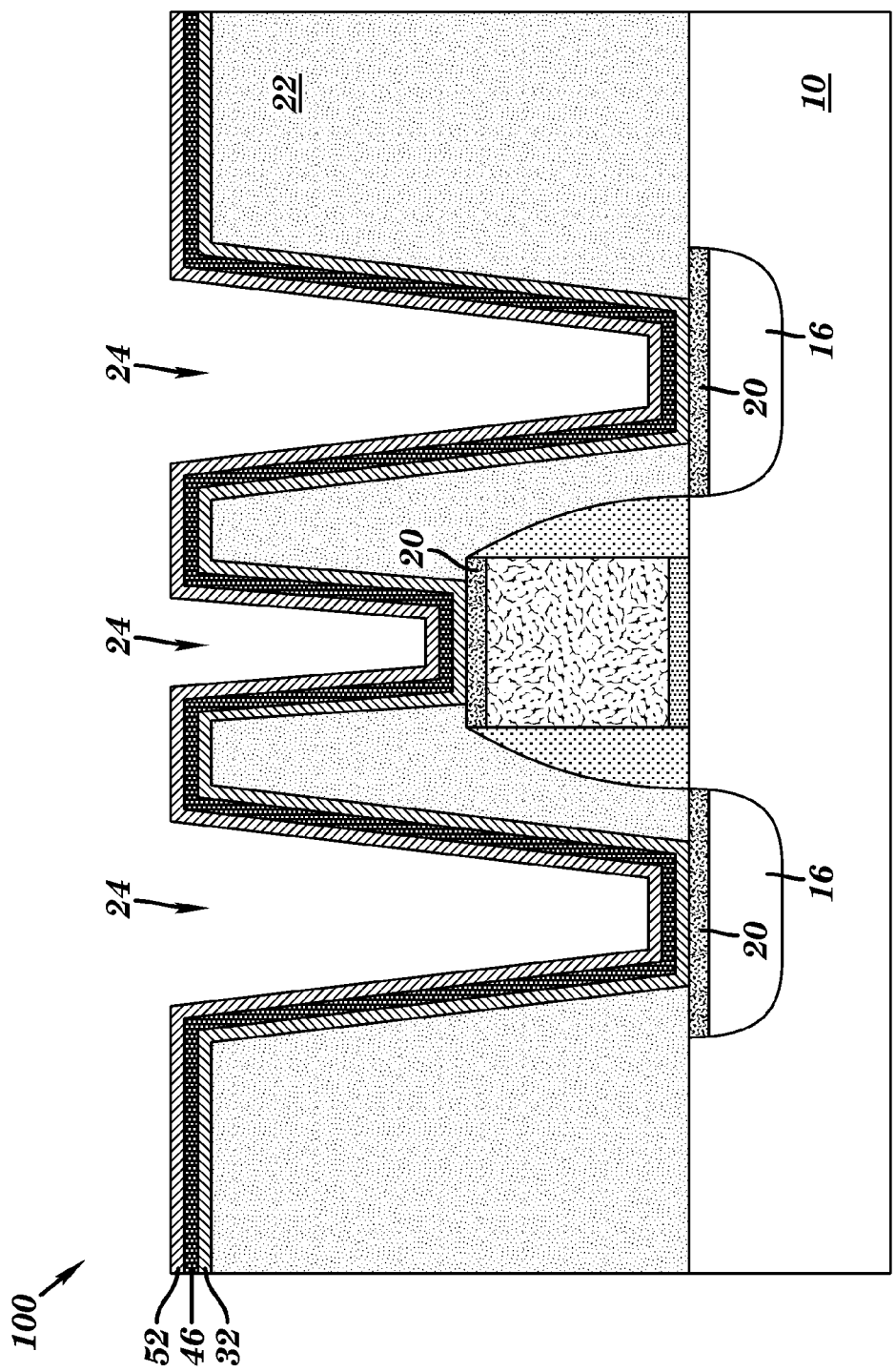
FIG. 5 is a cross-sectional view of the semiconductor structure depicting forming a barrier layer, according to an embodiment of the present disclosure.

Referring now to FIG. 5, a barrier layer 52 may be conformally deposited in the contact openings 24 directly on top of the second metal liner 46, according to an embodiment of the present disclosure. The barrier layer 52 may prevent fluorine diffusion from the tungsten hexafluoride ($WF_6$) precursor subsequently used during tungsten (W) deposition. In one embodiment, the barrier layer 52 may include titanium nitride (TiN) and may be deposited by an atomic layer deposition (ALD) process. In another embodiment, a chemical vapor deposition (CVD) process may be conducted to form the barrier layer 52. The barrier layer 52 may have a thickness varying from approximately 2 nm to approximately 5 nm.

In some embodiments, the second metal liner 46 may provide a template for ALD or CVD growth of the barrier layer 52 with lower diffusivity for fluorine coming from the $WF_6$ precursor, generally employed in CVD tungsten deposition. Texture inheritance may be the mechanism by which the barrier layer 52 may adopt the texture or crystalline orientation of the underlying second metal liner 46 (low ACT film). In such embodiments, the texture of the barrier layer 52 may be affected by the underlying second metal liner 46, allowing the formation of a barrier layer 52 having controlled texture, which may in turn enhance the arresting properties of the barrier layer 52 in order to avoid F—Ti reaction driven defectivity and preserve yield. It should be noted that the presence of the second metal liner 46 may allow for a barrier layer 52 that may be thinner than traditionally formed titanium nitride barrier layers.

In embodiments in which the contact areas 20 have not been formed, a thermal treatment may be conducted on the semiconductor structure 100 after deposition of the barrier layer 52, to initiate the silicidation process and form the contact areas 20. For example, a laser-based annealing such as a laser spike anneal (LSA) treatment may be conducted to initiate the silicidation of the active regions of the semiconductor structure 100. During the annealing process a silicide material such as $TiSi_2$ may be formed in the source-drain regions 16 and the gate electrode 14 creating the contact areas 20 of the semiconductor structure 100. The laser-based anneal treatment may vary from approximately 0.2 to approximately 1 milliseconds, at a temperature ranging from approximately 700° to approximately 1,200° C., in an ambient atmosphere or N2, Ar, or N2+Ar ambients.

Figure 6:
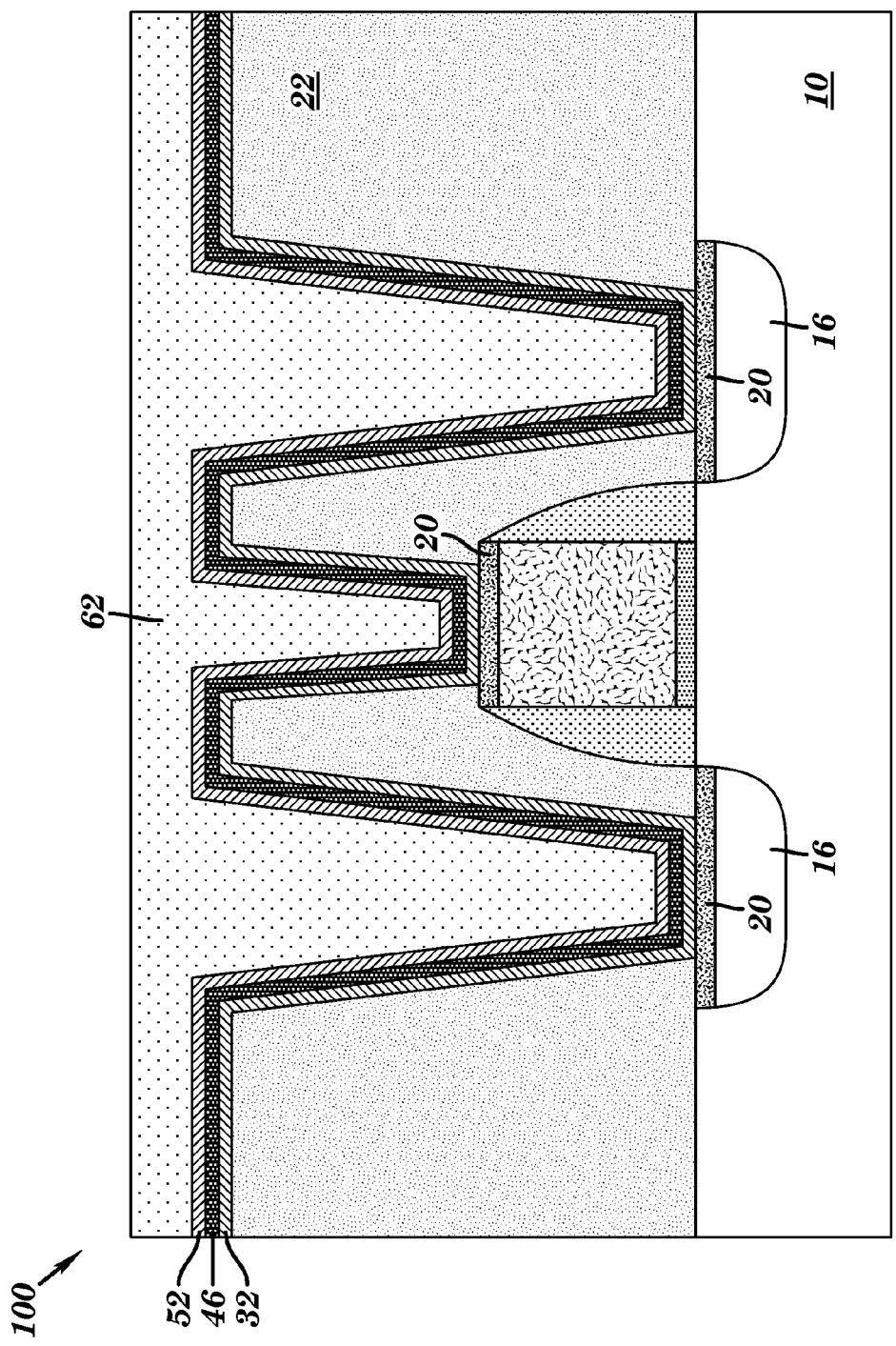
FIG. 6 is a cross-sectional view of the semiconductor structure depicting forming a conductive layer, according to an embodiment of the present disclosure.

Referring now to FIG. 6, a tungsten layer 62 may be deposited in the contact openings 24 to form middle-of-the-line (MOL) contacts in the semiconductor structure 100, according to an embodiment of the present disclosure. At this step of the manufacturing process, the contact openings 24 (FIG. 5) may be lined by a multiple layer stack formed by the first metal liner 32, the second metal liner 46 and the barrier layer 52. The tungsten layer 62 may be formed by any deposition process known in the art, such as, for example, CVD. The tungsten layer 62 may overfill the contact openings 24 (FIG. 5) as depicted in the figure.

Figure 7:
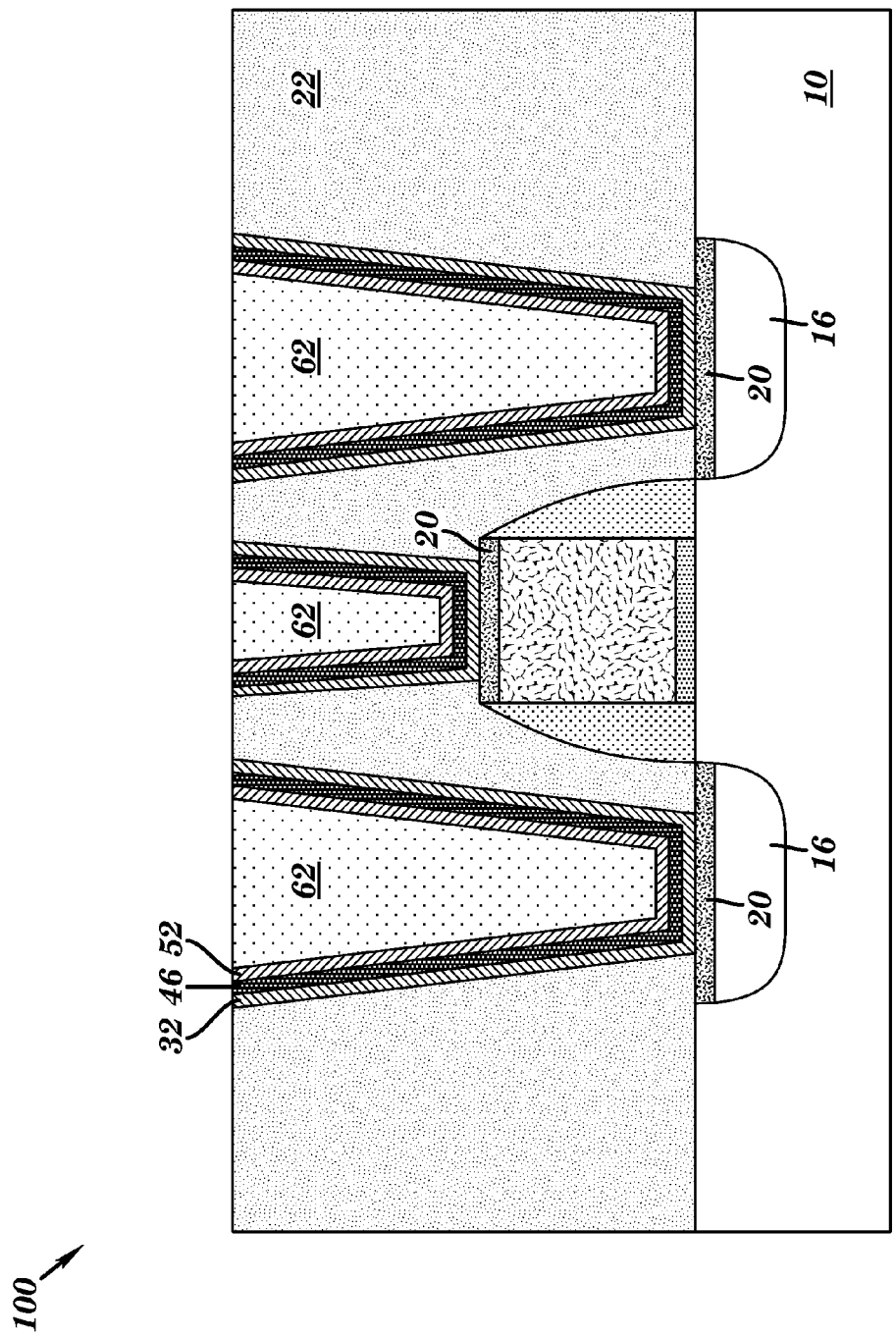
FIG. 7 is a cross-sectional view of the semiconductor structure depicting conducting a planarization process, according to an embodiment of the present disclosure.

Referring now to FIG. 7, a chemical mechanical polishing (CMP) process may be conducted to planarized the tungsten layer 62, eliminating the overfill regions shown in FIG. 6, according to an embodiment of the present disclosure. The portions of the first metal liner 32, second metal liner 46 and barrier layer 52 above the dielectric layer 22 may also be removed using, for example, another CMP process. In some embodiments, different chemical slurries may be used during the same CMP process in order to remove excess of the tungsten layer 62 as well as the portions of the first metal liner 32, second metal liner 46 and barrier layer 52 above the dielectric layer 22. The CMP process may be conducted until a top surface of the tungsten layer 62 may be substantially flush with a top surface of the dielectric layer 22.

Therefore, by using a high ACT range to form a first metal liner 32 followed by using a low ACT range to form a second metal liner 46 in a contact opening, an oxygen-getter film having two different ACT bias combinations may be formed with the following characteristics: enhanced oxygen gettering properties and low contact resistance provided by the high ACT titanium layer (first metal liner 32) and reduced reactivity with fluorine provided by the low ACT titanium layer (second metal liner 46). Additionally, the small grain size of the low ACT layer may help improving the structural properties of the barrier layer for enhanced control of fluorine diffusion.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a first metal liner conformally along a sidewall and a bottom of a contact opening;
   forming a second metal liner above and in direct contact with the first metal liner, wherein a grain size of the first metal liner is larger than a grain size of the second metal liner;
   forming a barrier layer above and in direct contact with the second metal liner; and
   filling the contact opening with a conductive material to form a middle-of-the-line contact.

2. The method of claim 1, wherein forming the first metal liner comprises:
   depositing a titanium film having a larger grain size than the second metal liner and an aligned crystalline orientation, the larger grain size and the aligned crystalline orientation of the titanium film provide good oxygen scavenging properties, low electrical resistivity and enhanced titanium silicide formation.

3. The method of claim 1, wherein forming the second metal liner comprises:
   depositing a titanium film having a smaller grain size than the first metal liner and a random crystalline orientation, the smaller grain size and the random crystalline orientation of the titanium film reduce fluorine diffusion from the conductive material to the first metal liner.

4. The method of claim 1, wherein forming the first metal liner and the second metal liner comprises:
conducting a radio frequency physical vapor deposition (RFPVD) process in a RFPVD chamber including an automatic capacitance tuning resonant circuit, wherein the grain size and crystalline orientation of the first and the second metal liners are controlled by varying a normalized capacitance of the automatic capacitance tuning resonant circuit.

5. The method of claim 4, wherein conducting the radio frequency physical vapor deposition comprises:
using a normalized capacitance ranging between approximately 75% to approximately 95% to form the first metal liner.

6. The method of claim 4, wherein conducting the radio frequency physical vapor deposition comprises:
using a normalized capacitance ranging between approximately 10% to approximately 28% to form the second metal liner.

7. A method comprising:
providing a semiconductor device, the semiconductor device comprising a contact area;
depositing a dielectric layer above the semiconductor device and above the contact area;
etching the dielectric layer to form an opening, the opening in the dielectric layer exposes the contact area of the semiconductor device;
depositing a first metal liner along a sidewall and a bottom of the opening, the first metal liner positioned directly above the contact area;
depositing a second metal liner in the opening above and in direct contact with the first metal liner, wherein a grain size of the first metal liner is larger than a grain size of the second metal liner;
depositing a barrier layer in the opening above and in direct contact with the second metal liner; and
filling the opening with a conductive material to form a middle-of-the-line contact.

8. The method of claim 7, wherein depositing the first metal liner comprises:
depositing a titanium film having a larger grain size than the second metal liner and an aligned crystalline orientation, the larger grain size and the aligned crystalline orientation of the titanium film provide good oxygen scavenging properties, low electrical resistivity and enhanced titanium silicide formation.

9. The method of claim 7, wherein depositing the second metal liner comprises:
depositing a titanium film having a smaller grain size than the first metal liner and a random crystalline orientation, the smaller grain size and the random crystalline orientation of the titanium film reduce fluorine diffusion from the conductive material to the first metal liner.

10. The method of claim 7, wherein depositing the first metal liner and the second metal liner comprises:
conducting a radio frequency physical vapor deposition (RFPVD) process in a RFPVD chamber including an automatic capacitance tuning resonant circuit, wherein the grain size and crystalline orientation of the first and the second metal liners are controlled by varying a normalized capacitance of the automatic capacitance tuning resonant circuit.

11. The method of claim 10, wherein conducting the radio frequency physical vapor deposition comprises:
using a normalized capacitance ranging between approximately 75% to approximately 95% to form the first metal liner.

12. The method of claim 10, wherein conducting the radio frequency physical vapor deposition comprises:
using a normalized capacitance ranging between approximately 10% to approximately 28% to form the second metal liner.

13. The method of claim 7, wherein depositing the barrier layer in the opening above and in direct contact with the second metal liner comprises:
forming a barrier layer with a crystalline orientation adopted from the second metal liner to reduce fluorine diffusion to the first metal liner.

14. The method of claim 7 further comprising:
forming a contact area in the semiconductor device by performing a laser-based anneal treatment prior to filling the opening with the conductive material,
wherein the contact area comprises a low-resistivity silicide material.

15. A structure comprising:
a semiconductor device comprising a contact area;
a dielectric layer above the semiconductor device; and
a middle-of-the-line contact in the dielectric layer, the middle-of-the-line contact comprising:
a first metal liner along a sidewall and a bottom of the middle-of-the-line contact and directly above the contact area,
a second metal liner above and in direct contact with the first metal liner, a grain size of the first metal liner is larger than a grain size of the second metal liner,
a barrier layer above and in direct contact with the second metal liner, and
a conductive material above the barrier layer, the conductive material substantially fills the middle-of-the-line contact.

16. The structure of claim 15, wherein the first metal liner comprises:
a titanium film having a larger grain size than the second metal liner and an aligned crystalline orientation, the larger grain size and the aligned crystalline orientation provide good oxygen scavenging properties, low electrical resistivity and enhanced titanium silicide formation.

17. The structure of claim 15, wherein the second metal liner comprises:
a titanium film having a smaller grain size than the first metal liner and a random crystalline orientation, the smaller grain size and the random crystalline orientation reduce fluorine diffusion from the conductive material to the first metal liner.

18. The structure of claim 15, wherein the barrier layer has a similar grain size and crystalline orientation as the second metal liner.

19. The structure of claim 15, wherein the barrier layer comprises titanium nitride.

20. The structure of claim 15, wherein the conductive material comprises tungsten.

* * * * *